(12) United States Patent
Dietzel et al.

(10) Patent No.: US 6,292,316 B1
(45) Date of Patent: Sep. 18, 2001

(54) DETECTION AND CHARACTERIZATION OF DEFECTS ON SURFACES OF MAGNETIC DISKS

(75) Inventors: Andreas Dietzel, Wallertheim; Friedrich Fleischmann, Erlangen; Frank Krause, Mainz, all of (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/267,147

(22) Filed: Mar. 11, 1999

(30) Foreign Application Priority Data

Mar. 16, 1998 (DE) .............................. 198 11 347

(51) Int. Cl.⁷ .................................................. G11B 27/36
(52) U.S. Cl. ................................ 360/31; 360/53; 360/25; 324/212
(58) Field of Search .................................. 360/31, 53, 25; 324/210, 212, 226; 73/105; 369/53, 58, 101, 53.2, 53.41, 53.42

(56) References Cited

U.S. PATENT DOCUMENTS

| | | | |
|---|---|---|---|
| 4,069,484 | * 1/1978 | Firester et al. | 356/237.5 |
| 4,896,227 | * 1/1990 | Fountain et al. | 360/31 |
| 4,935,811 | * 6/1990 | Tsuchihashi et al. | 369/58 |
| 6,081,113 | * 6/2000 | Tomita et al. | 324/210 |
| 6,134,955 | * 10/2000 | Han et al. | 73/105 |
| 6,140,814 | * 10/2000 | Sundaram | 360/78.04 |

* cited by examiner

*Primary Examiner*—Alan T. Faber
(74) *Attorney, Agent, or Firm*—G. Marlin Knight; Ron Feece

(57) ABSTRACT

A magnetic disk tester which also incorporates a sensor such as an AFM or MFM is described. The device is able directly and quickly to detect and characterize sub-micrometric defects on the surface of magnetic disks. A process for finding and characterizing defects on a magnetic disk according to the invention comprises the steps of rotating the magnetic disk using a spindle motor; writing data on the magnetic disk at selected positions; finding a position on the magnetic disk having a defect which produces an error when reading the data from the magnetic disk; determining coordinates of the defect referenced from an index on the disk; stopping the spindle motor; positioning a sensing device such as an AFM or MFM head over the defect; and sensing characteristics of the defect which aid in determining a cause of the defect. A magnetic disk examination device embodying the invention comprises a spindle rotably connected to a spindle motor; a magnetic read/write head mounted on an actuator; a magnetic read/write tester for writing then reading magnetic data on the magnetic disk while rotating to find a position on the magnetic disk which produces read errors; a sensor mounted on an actuator which can be a second actuator or the same as the one for the read/write head; a positioning system which places the sensor at the position of the error while the magnetic disk is stationary; and a data acquisition system which gathers data using the sensor.

14 Claims, 5 Drawing Sheets

DETECTION AND CHARACTERIZATION OF DEFECTS ON SURFACES OF MAGNETIC DISKS

BACKGROUND OF THE INVENTION

1. Field of the Invention

The invention presented is a procedure for the targeted recognition and characterization of defects on the surface of magnetic disks. In particular, the invention recognizes those defects which are in the submicrometer range. It is also a device for executing such a procedure.

2. Description of Related Art

Magnetic disks are data storage devices with a very large storage capacity. Currently 1 GB can be stored on a magnetic disk of about 65 mm in size. The disks must have both exact magnetic and mechanical as well as certain tribological characteristics. When later used in a disk drive, the disks are rotated by a spindle motor at speeds typically ranging from 3600 to 10000 revolutions per minute. This means that the outer edge of the disk reaches a speed of up to 100 km/h while the write/read head is flying at less than one twenty-thousandths of a millimeter (<50 nm) away from the disk surface. These quality requirements can only be achieved through the greatest precision in manufacture and statistical process controls.

To achieve higher storage densities, a thin magnetic film medium is used for recording data on modern high-capacity magnetic disks. Defects which are distributed across the surface of these thin film disks can significantly worsen the production yield of disk drives. These defects can be caused by a local change in the topography or the magnetic structure. Examples of this are the so-called "thermal asperities" or "missing bits". Thus submicrometer defects, i.e., defects <=1 μm, can lead to defective magnetic disks. The specific location and the exact characterization of these defects is therefore extremely important for manufacturing magnetic disks.

It is particularly important to create a correlation between the submicrometer defects, the topography of the magnetic disk or its magnetic structure and the resulting errors in read signals. This is the basis for a general analysis of defects on the disk and the assessment of its relevance for error-free function of the hard-disk drive in which these magnetic disks are used.

The tests used to locate errors in the read signal, cannot characterize the cause of the error. This characterization with regard to topography and the magnetic characteristics may be carried out using an atomic force microscope (AFM), magnetic force microscope (MFM) or other appropriate sensing device. The maximum area which can be recorded with such devices is typically 100 μm×100 μm.

The determination of the cause of an error as a magnetic and/or topographic defect is possible with the current state of the art using the steps of a) magnetically marking the defect on the magnetic (MAGNETIC) tester, b) highlighting the mark using ferrofluid, c) then mechanical marking the position, d) removal of the ferrofluid, and e) subsequent examination, e.g. by AFM and/or MFM. In this procedure it is possible that on removing the ferrofluid relevant defects are also removed and the disk may be soiled or otherwise damaged. In most cases, this makes specific analysis impossible. In addition, the average time requirement for this procedure starts at 1 day or more for one single defect, making it impractical for production use.

There is a further possibility of improving the magnetic marking technique as described in the following paragraph. In this, the disadvantages in using ferrofluid stated above are avoided. A direct allocation of signal faults and defects is possible which can give important information on the cause of the fault. However, even with this method, the time requirement is still high (>=1 day). Also, an examination of all relevant cases has to be excluded in this procedure and the analysis limited to test samples.

The magnetic disk along with its defects is first inserted into a MAG tester. Defects are detected at typical rotational speeds as an error in the read signal (see FIG. 3, upper curve) and its coordinates (radius $r_i$, angle position $\phi_i$) is established. The angle $\phi$ is counted from a prestated reference position (Index 0) given by the spindle drive of the magnetic disk. The radial position $r_i$ is measured outwards from the rotation axis of the spindle. The programs required for this are available to the tester. Then a specific defect is selected. On the radius $r_i$ of the magnetic disk, a track is now written, allowing a 50–100 μm hole around it so that the defect itself is not overwritten. The interruption of the recorded data on the track now marks the position of the defect. A second track is written at $r_i$ −10 μm which only extends from index 0 to $\phi_i$ If more than one defect is examined, then the previously described steps must be repeated for each additional defect. As the marking does take up some space, it is not possible to simultaneously mark defects whose radial coordinates are narrower than the width of the marking.

Then a mark for index 0 is applied mechanically to the magnetic disk. The width of this mark is generally >500 μm. The magnetic disk is now removed from the MAG tester and inserted into the MFM (or AFM). The position of the source of the coordinates is lost in this removal and reinsertion. The offset to the new source can be up to 700 μm.

In the next step, the radius $r_i$ and the angle $\phi_i$ are roughly set by hand and the MFM measurement is started. Should one of the previously written tracks be visible within the measuring window, then the measuring window is centered on it. For this, a sample table procedure is required. If no track can be found, then the table is moved radially and a new measurement started until the tracks are found.

After the radial coordinates are found, the angle coordinates are now set, for which MFM or AFM measurements are again required, before the actual MFM or AFM measurement can take place (see FIG. 3, lower curve for AFM or FIG. 4 for MFM). To locate the exact position ($r_i$, $\phi_i$), a practiced operator requires up to 180 minutes. The total time requirement for this method is therefore approximately 1 day or more per defect.

The current procedures require at least two devices to locate the defect position, to mark it and to characterize it. In transferring the disks from the first device on which the detection of the defects was made using the read signal, to the second device which carries out the actual characterization, the disk must be removed from the spindle holder. In doing so, the reference points of the spindle coordinate system are lost. A reconstruction of the coordinate system using the described marking technique is very laborious and of only limited accuracy as the magnetic disk cannot be stored centrally either on the spin stand or in AFM/MFM because of the normal production tolerances.

SUMMARY OF THE INVENTION

The task of the invention is to make available a procedure which allows defects to be detected and characterized at the same time in the submicrometer range on the surface of a magnetic disk. An additional task of the invention is to provide such a procedure which can carry out such an examination within a practical time period. A further task of the invention is to make available a device for carrying out this procedure. Further advantages of the invention presented are in the possibility of carrying out extended parametric measurements through the MFM signal for characterizing the magnetic disk or the write element. In addition, after a complete analysis of the magnetic disk, this must be neither damaged nor contaminated so that an additional use or further analysis of the disk are possible.

Further, there is the option of facilitating the mechanical marking of the defect location on the magnetic disk with ink, a laser created spot or a stylus, etc. In this way, the defect can be accessed by other characterization possibilities.

In addition, AFM/MFM line scans with the affected signal course can be brought on site for the purposes of covering in order to illuminate the physical causes of the signal error.

In summary a process for finding and characterizing defects on a magnetic disk comprises the steps of rotating the magnetic disk using a spindle motor; writing data on the magnetic disk at selected positions; finding a position on the magnetic disk having a defect which produces an error when reading the data from the magnetic disk; determining coordinates of the defect referenced from an index on the disk; stopping the spindle motor; positioning a sensing device such as an AFM or MFM head over the defect; and sensing characteristics of the defect which aid in determining a cause of the defect.

A magnetic disk examination device embodying the invention might comprise a spindle rotably connected to a spindle motor; a magnetic read/write head mounted on an actuator; a magnetic read/write tester for writing then reading magnetic data on the magnetic disk while rotating to find a position on the magnetic disk which produces read errors; a sensor mounted on an actuator which can be a second actuator or the same as the one for the read/write head; a positioning system which places the sensor at the position of the error while the magnetic disk is stationary; and a data acquisition system which gathers data using the sensor.

DESCRIPTION OF THE DRAWINGS

The invention is described in detail in the following text using the drawings, in which.

DESCRIPTION OF THE PREFERRED EMBODIMENT

First it must be stated that the invention presented is not limited to the use of an AFM/MFM, but other high-resolution sensing devices such as light optical microscopes, profilemeters, micro-Raman devices, etc. can also be combined with the MAG tester using the concepts of the invention. For the sake of simplicity, however, the combination of MAG tester and AFM/MFM is described in the following.

Figure 1:
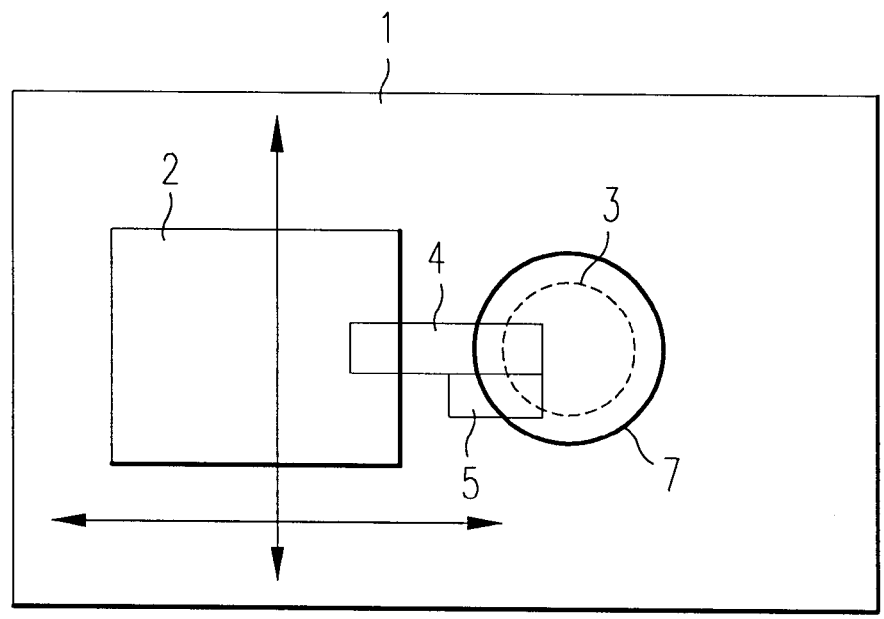
FIG. 1 shows a device according to the invention in which a magnetic head and the sensor are located on a common actuator.
Figure 2:
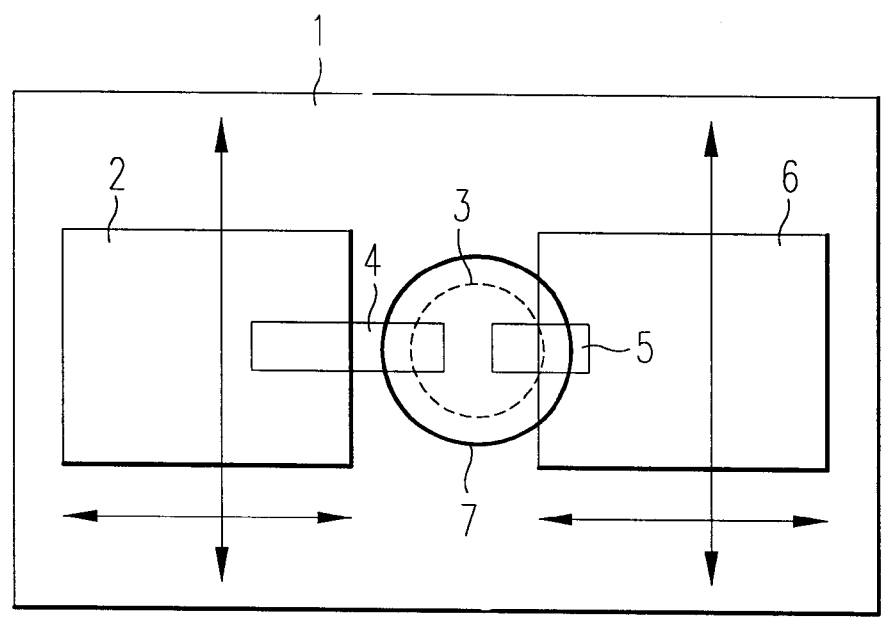
FIG. 2 shows a device according to the invention in which a magnetic head and the sensor are located on a separate actuators.
Figure 3:
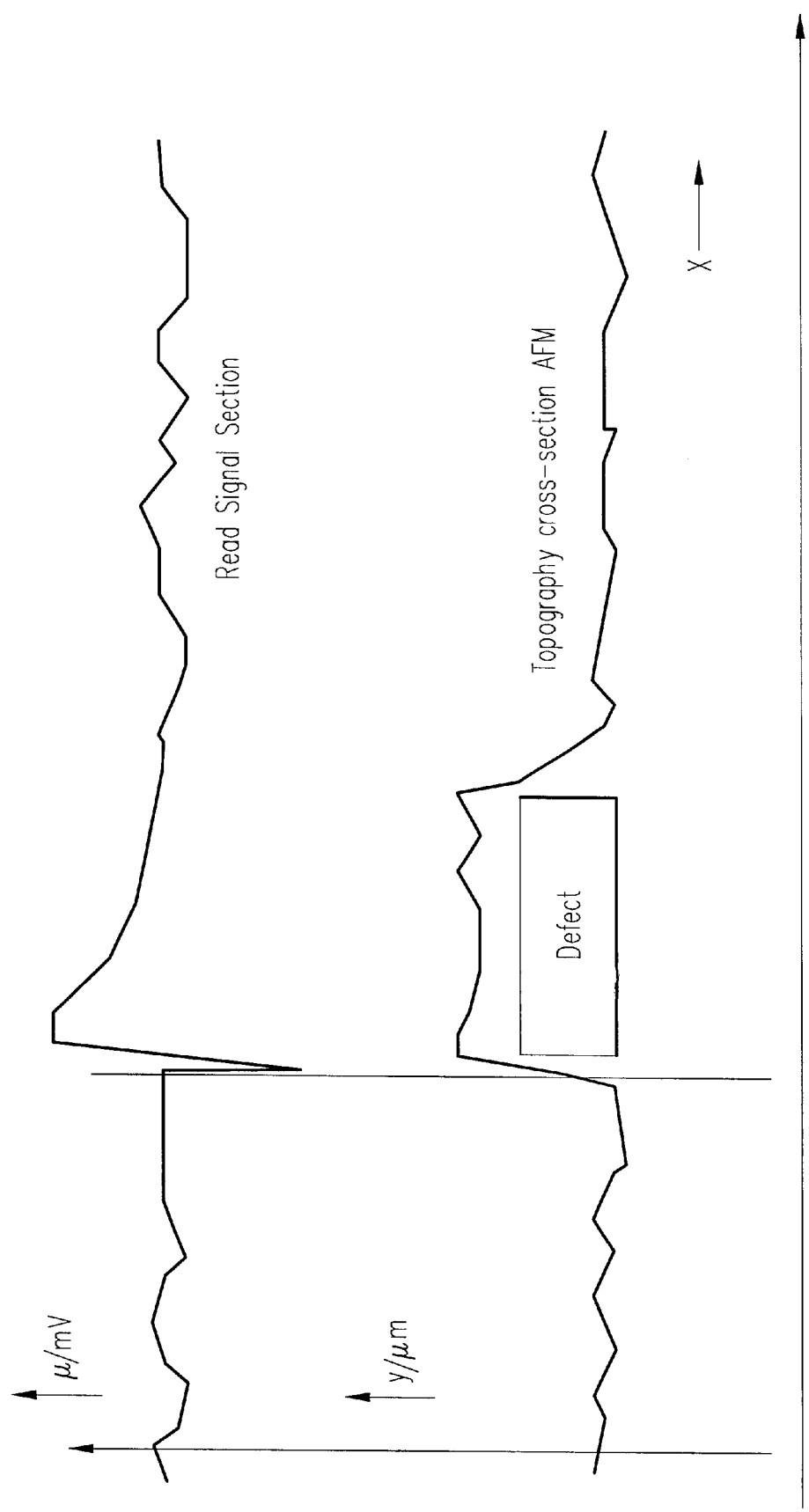
FIG. 3 represents the read signal of the MAG tester dependent on the topography of the magnetic disk determined using an AFM.
Figure 4:
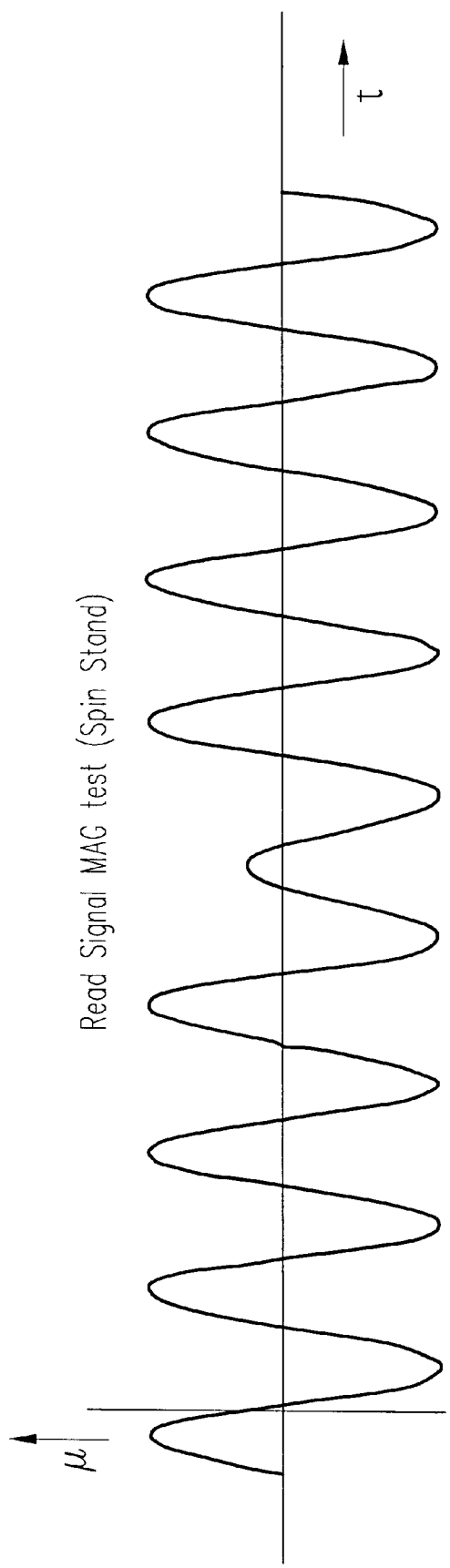
FIG. 4 shows the read signal of the MAG tester dependent on a picture of a track on a magnetic disk taken using a MFM.
Figure 4:
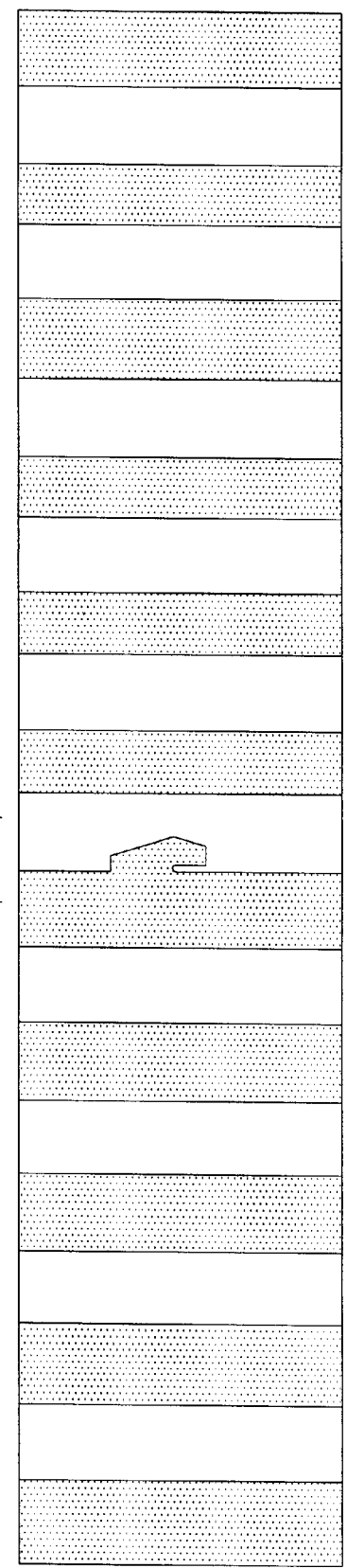

FIGS. 1 and 2 show possible arrangements of a combined MAG-MFM tester according to the invention. The spin stand of a MAG tester, consisting of a base plate 1, the positioning unit 2, spindle 3 with disk pick-up and the head holder 4 is extended by using the measurement head 5 of a MFM. In the first arrangement (see FIG. 1), the measurement head is fixed immediately on the head holder 4 of the MAG tester. The head holder and MFM or AFM measurement head are thus moved using one and the same positioning unit 2 which is already present. In the second arrangement (see FIG. 2), the head holder 4 and the MFM measurement head 5 are moved independently of one another in the common coordinate system of the spindle 3. In this, an additional, independent positioning unit 6 is used. The measurement head 3 and the write/read head (not shown) fastened on the underside of the MAG head holder 4 of the MAG tester thus simultaneously access different positions on the same magnetic disk 7 being examined. In both arrangements, a fixed common coordinate system is formed which remains for the whole characterization procedure, i.e., the source of the coordinates is the same for the whole measurement procedure. Conversely, this allows the position of the MFM measurement head 5 to be given relative to the index. Together with the radial coordinates which are determined by the rotation axis of the spindle 3, an exact position of a defect affecting the read signal can be determined. The offset resulting from the arrangement between the head holder 4 and the MFM measurement head 5 must be measured once for this.

Figure 5:
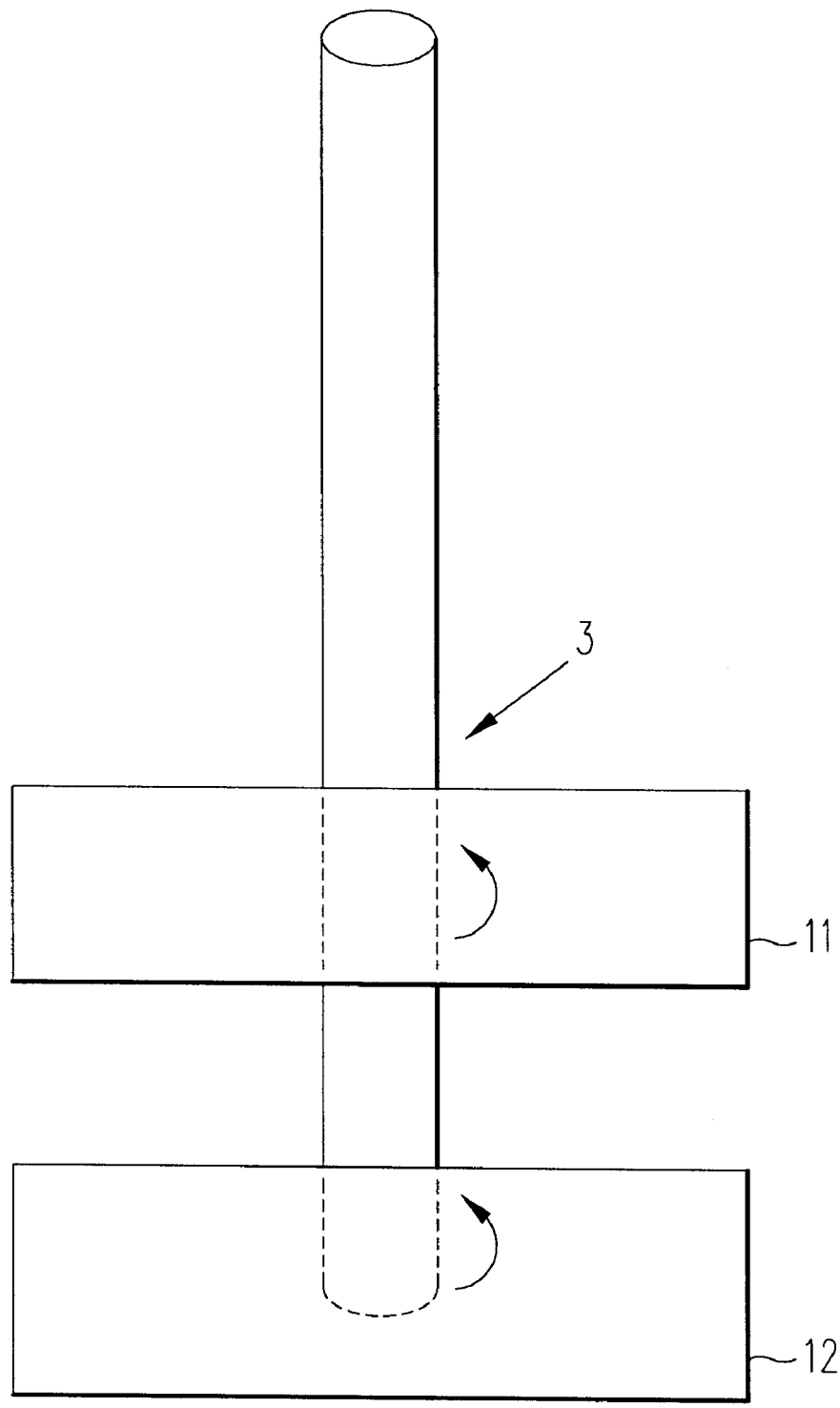
FIG. 5 shows a spindle motor and a stepper motor driving a common spindle.

FIG. 5 shows spindle 3 which is coupled to a standard spindle motor 11 for rotating the disk at speeds required for magnetic read/write testing. Precise angular positioning of the magnetic disk cannot in general be achieved using the spindle motor because its step accuracy is far too low and the high minimum speed makes exact stopping of the magnetic disk impossible. Therefore, an additional stepping motor 12 is coupled to the spindle which is used to set the angular coordinates. The read signal cannot be used as a feedback signal for determining the position since at low spindle speeds the magnetic write/read head drags on the magnetic disk. Alternatively, the rotational and stepping functions may be combined in a modified spindle motor which has good step resolution and extremely slow rotation capability. The stepping motor and spindle motor are not used simultaneously. When one is driving the spindle the other motor is passive.

For smooth cooperation between the MAG tester and the MFM, the exchange of some data and signals between the devices is required. This includes, for example, the index signal generated by the spindle drive, through which the zero angle can be determined at slow and fast speeds of the magnetic disk 7 fixed on the spindle 3. This exchange of data and signals can be carried out via one separate and/or multiple interfaces of the measurement computer in a known way. Alternatively, the use of a single measurement computer is possible.

Figure 6:
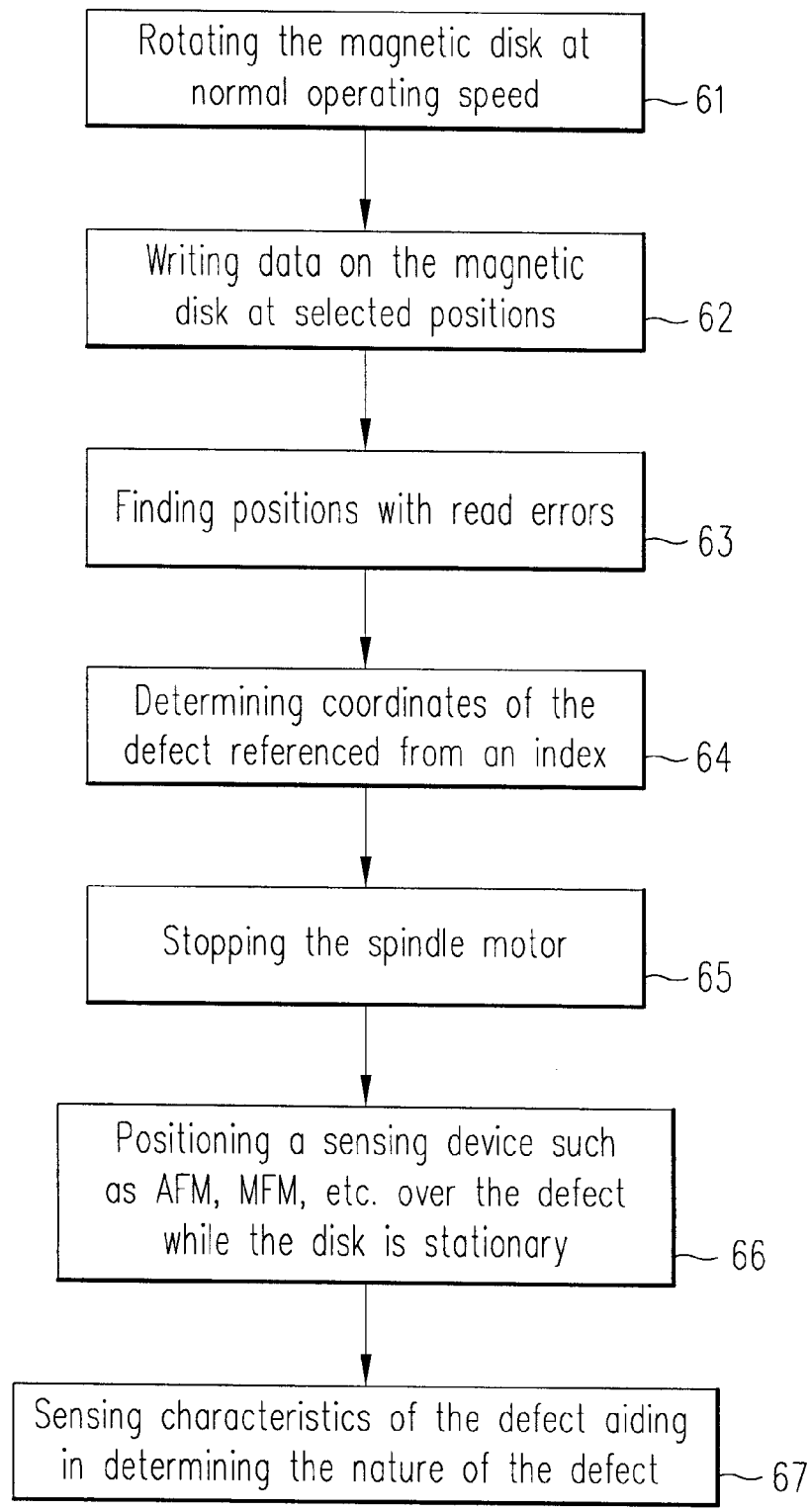
FIG. 6 is a high level flow chart of a method according to the invention.

With reference to FIG. 6, a procedure embodying the invention contains the following steps: First the magnetic disk with the defects on it is placed on the spindle of the tester which rotates the disk at normal operating speed 61. The defects are detected as errors in the read signal 63 by writing 62 then reading back using a magnetic read/write head at the relatively high speed produced by the spindle motor. The coordinates $r_i$, $\phi_i$ of the defects are determined 64 and prepared for the positioning system stepping motor control. The high speed spindle motor is stopped 65 and any one defect is selected.

The positioning system then moves the sensor over the position which was recorded for the error 66. This can be accomplished as follows. The stepping motor now turns the spindle slowly (approx. 50 rpm) until the index signal is detected and then falls off. While the index signal is present, the motor steps can be counted until the fall in the signal. The center of the index signal is set as index 0.

Now the number of steps required is counted in order to move from index 0 to the analysis position $\phi_i + \Delta\phi_1$ where $\Delta\phi$ is the angle offset between the write/read head and the AFM/MFM measurement head. $\Delta\phi$ must be uniquely determined during initialization of the device.

A linear table now moves the AFM/MFM measurement head to the radius position $r_i$ of the defect and the AFM/MFM characterization of the local environment of the defect is carried out 67. In this it is not necessary to remove the magnetic disk from the one device and insert it into the other. Additional measurements for seeking the defect are therefore not required. Once the sensor is in place over the position corresponding to the read error, the needed data is acquired through a standard data acquisition system or process.

The same procedure can be repeated for additional defects on the magnetic disk. The time taken for positioning takes approx. 5–10 minutes. For the overall characterization approximately 60 minutes are required per defect. Therefore using the invention procedure, a dramatic saving in time can be achieved at the same or better levels of quality.

Additional advantages of the invention presented are to be found in the possibility of carrying out extended parametric measurements using the MFM signal for characterizing the magnetic disk or the write element.

In addition, after complete analysis of the magnetic disk, the disk is neither damaged nor contaminated, so that further use or further analysis of the disk can be made.

In addition, it is possible (for example using ink jets, lasers or steel needles) to mechanically mark the defect site when the disk is standing still. This way the defect can be made accessible to other characterization possibilities.

In addition, AFM/MFM linescans with the affected signal course can be brought on site for the purposes of covering in order to illuminate the physical causes of the signal error.

We claim:

1. A method for finding and characterizing defects on a magnetic disk comprising the steps of:
   connecting the magnetic disk with a spindle motor.
   rotating the magnetic disk using the spindle motor;
   writing data on the magnetic disk at selected positions;
   finding a position on the magnetic disk having a defect which produces an error when reading the data from the magnetic disk using a magnetic head;
   determining coordinates of the defect referenced from an index;
   stopping the spindle motor;
   positioning a sensing device over the defect while the magnetic disk is stationary, the disk remaining connected with the spindle motor; and
   sensing characteristics of the defect which aid in determining a cause of the defect.

2. The method of claim 1, wherein the step of positioning a sensing device further includes rotating the magnetic disk using a stepping motor.

3. The method of claim 2, wherein the step of positioning a sensing device further includes:
   rotating the spindle until an index signal is detected; and
   rotating the spindle until the index signal falls while counting motor steps.

4. The method of claim 3, wherein the step of positioning a sensing device further includes the step of calculating a number of motor steps from the index to the defect using coordinates of the defect and the offset angle between the sensing device and the magnetic head.

5. The method of claim 1, wherein the sensing device is a head for an atomic force microscope or magnetic force microscope.

6. The method according to claim 1, wherein the sensing device is a head for a high-resolution analyzer selected from the group consisting of an optical microscope, a profilometer and a micro-Raman device.

7. The method of claim 1 further comprising mechanically marking the defect location on the magnetic disk.

8. A magnetic disk examination device comprising:
   a spindle rotationally connected to a spindle motor;
   a magnetic read/write head mounted on an actuator;
   a magnetic read/write tester for writing then reading magnetic data on the magnetic disk while rotating to find a position on the magnetic disk which produces read errors;
   a sensor mounted on an actuator;
   a positioning system which places the sensor at the posistion while the magnetic disk is stationary and connected with the spindle;
   a data acquisition system which gathers data using the sensor.

9. The device of claim 8 further comprising a coordinate recorder which determines the coordinates of the position and wherein the positioning system uses the coordinates to place the sensor.

10. The device of claim 8 wherein the positioning system further comprises a stepper motor.

11. The device of claim 8 wherein the magnetic read/write head and the sensor are mounted on a common actuator.

12. The device of claim 8 wherein the magnetic read/write head and the sensor are mounted on different actuators and the positioning system uses an offset between the magnetic read/write head and the sensor to find the position.

13. The device of claim 8 further comprising means for marking an index position on the magnetic disk before magnetic testing and wherein the position system further includes means for reading the index.

14. The device of claim 8 wherein the position is determined at least in part based upon the rotational position of the spindle.

* * * * *